US 6,636,443 B2

(12) United States Patent
Kang

(10) Patent No.: US 6,636,443 B2
(45) Date of Patent: Oct. 21, 2003

(54) SEMICONDUCTOR MEMORY DEVICE HAVING ROW BUFFERS

(75) Inventor: Byung Joo Kang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 29 days.

(21) Appl. No.: 10/021,401

(22) Filed: Oct. 30, 2001

(65) Prior Publication Data

US 2002/0054515 A1 May 9, 2002

(30) Foreign Application Priority Data

Oct. 31, 2000 (KR) .............................. 10-2000-0064292

(51) Int. Cl.[7] ................................................ G11C 7/00
(52) U.S. Cl. ........................... 365/189.05; 365/230.08; 365/233; 365/236; 365/239; 365/194; 365/189.12
(58) Field of Search ....................... 365/189.05, 230.08, 365/233, 236, 239, 194, 189.12

(56) References Cited

U.S. PATENT DOCUMENTS 6,055,615 A * 4/2000 Okajima ..................... 711/169
6,351,427 B1 * 2/2002 Brown ................... 365/230.03
6,470,467 B2 * 10/2002 Tomishima et al. ......... 714/744

* cited by examiner

Primary Examiner—Richard Elms
Assistant Examiner—Nam Nguyen
(74) Attorney, Agent, or Firm—Ladas & Parry

(57) ABSTRACT

A semiconductor memory device has, among other things, a row buffer. The semiconductor memory device includes a memory cell array for storing data, the row buffer for storing data of a row of the memory cell array, and a state machine for controlling the semiconductor memory device. The semiconductor memory device stores data of the row determined by an inputted address signal from the memory cell array in the row buffer when a predetermined external command is inputted from the external, and outputs a part of the data according to the address signal from the row buffer to the external in a predetermined delay time.

16 Claims, 18 Drawing Sheets

SEMICONDUCTOR MEMORY DEVICE HAVING ROW BUFFERS

BACKGROUND OF THE INVENTION

1. Field of the Invention

The present invention relates to a semiconductor memory device, and more particularly, to a semiconductor memory device having row buffers capable of transmitting cell array data from DRAM including the row buffer to the external by one command.

2. Description of the Related Art

Generally, performance of computer system is lowered by performance difference between processors and memory. This is because efforts are focused on improving operation speed of processors and increasing capacity of memory. Therefore, in order to overcome the degradation, researches are being developed on methods for increasing operation bandwidth of memory or rapidly generating column address which is successively generated when a row is enabled.

However, it is difficult to increase effective bandwidth since recent computer systems have irregular memory access pattern in a memory area. Accordingly, researches are also being developed on a method for shortening latency of row cycle in order to improve effective bandwidth. For example, row buffers (in other words, register) have been formed in DRAM according to a conventional method. And, when accessed data are stored in the row buffer, the data are outputted without accessing data of memory cell. Therefore, row cycle is shortened and effective bandwidth is improved.

In another method such as cache DRAM, DRAM and SRAM are included in one chip to use SRAM as row buffer or to access DRAM and SRAM respectively. However, there is a problem in compatibility with DRAM. Therefore, only row buffers are used in order to interface with the external. Generally, DRAMs use background operation and foreground operation in order to read data stored in the row buffer (register). The background operation is performed between the inner part of DRAM and row buffer and the foreground operation between row buffer and external device. And, the background operation comprises prefetch operation for transmitting data from cell array to row buffer and restore operation for transmitting data from row buffer to cell array. The foreground operation comprises read operation and write operation. As described above, conventional DRAMs are interfaced with external devices through row buffer. In DRAM using row buffer to accomplish compatibility with SDRAM, a control circuit is additionally required to control the row buffer since background operation and foreground operation are controlled by using /RAS, /CAS, /WE and /CS in accessing DRAM from the external.

FIG. 1 is a block diagram of conventional SDRAM. Referring to FIG. 1, a row active activation signal ras6 is enabled according to active command ACT and then, a row decoder unit 40 is operated, thereby activating word line WL corresponding to row address. And, a column active activation signal casp6 is activated according to read command and then, a column decoder unit (not shown) is operated, thereby activating bit line corresponding to column address. And, data from local data bus and global data bus are sensed and transmitted to a data output buffer 52 by a column decoder output signal Yi.

FIG. 2 is a block diagram for showing a conventional DRAM including row buffer between bit line sense amp and data bus sense amp. Referring to FIG. 2, an operation is additionally performed to transmit data from cell array block to row buffer.

That is, prefetch operation PFC signal is enabled, thereby selecting a register corresponding to row buffer address. And then, a signal controlling background operation of DRAM bgp6 is activated, thereby selecting and operating one of 4 bit line sense amp BLSA connected to one transfer bus. Subsequently, data sensed in the bit line sense amp are transmitted to row buffer through transfer bus line. When a read command is received, column active activation signal casp6 is activated and column decoder output signal Yi is outputted and then, data through local data bus LDB and global data bus GDB are sensed and outputted to data output buffer.

FIG. 3 is a block diagram for showing a state machine of conventional SDRAM. The state machine comprise clock buffer units 210–220, a command decoder unit 230, an address buffer unit 240, an address latch unit 250, a mode decoder unit 260, a row address predecoder unit 270 and a column address predecoder unit 280.

The command buffer units 210~216 input /RAS, /CAS, /WE and /CS, respectively and the clock buffer unit 220 inputs external clock CLK and generates internal signals clkp2 and clkmc. The command decoder unit 230 inputs the internal command signal outputted from the command buffer units 210~216 and the output signal clkp2 of the clock buffer unit 220 and outputs row active signal rasp6, column active signal casp6 and internal signal mrsp6. The address buffer unit 240 inputs external address and the address latch unit 250 latches output signal of the address buffer unit 240 according to output signal clkmc of the clock buffer unit 220. The mode decoder unit 260 inputs the output signal mrsp6 of the command decoder unit 230 and output signal ea<0:10> of the address latch unit 250 and generates cas latency cl1, cl2 and cl3. The row address predecoder unit 270 inputs the row active signal rasp6 and output signal ea<0:10> of the address latch unit 250 and generates a signal gax activating word line enable signal WE. The column address predecoder unit 280 inputs the column activation signal casp6 and the output signal ea<0:10> of the address latch unit 250 and generates a signal gay activating column selection signal Yi.

According to the conventional SDRAM, /RAS, /CAS, /WE and /CS received from the external are synchronized with clock signal received from the external to generate row activation signal rasp6 and cas activation signal casp6, internally. And, CAS Latency CL is determined by using address received to address buffer in the operation of mode register set MRS. However, the conventional semiconductor memory device has several problems. That is, according to the conventional SRAM, data are transmitted from DRAM core by one command (read or write). However, according to the conventional semiconductor memory device having row buffers, data are transmitted by two commands-background operation (prefetch or restore) and foreground operation (read or write). As a result, the conventional semiconductor memory device has a problem of incompatibility with SRAM.

SUMMARY OF THE INVENTION

Therefore, the present invention has been made to solve the above problems and the object of the present invention is to provide a semiconductor memory device having row buffers being compatible with SRAM and having improved effective bandwidth by outputting cell array data according to one command.

In order to accomplish the above object, the semiconductor memory device according to the present invention comprises: a memory cell array for storing data; a row buffer for storing data of a row of the memory cell array; and a state machine for controlling the semiconductor memory device to firstly store data of the row determined by an inputted address signal from the memory cell array in the row buffer when a predetermined external command is inputted from the external, and then to output a part of the data according to the address signal from the row buffer to the external in a predetermined delay time.

The state machine comprises a command decoder for generating column activation signal, mode register set signal and first internal command signal; a mode decoder for generating mode signals determining the generation time of column activation signal according to corresponding address signal when the mode register set signal is inputted from the command decoder; and a control block for generating control signal which controls the command decoder to generate the column activation signal at the time determined by the mode signals when the first internal command signal is inputted from the command decoder according to the input of the predetermined external command. And the state machine further includes: an address latch unit for latching address signal inputted from the external; and a clock buffer unit for generating a first internal clock signal for synchronizing the command decoder and a second internal clock signal for synchronizing the address latch unit by receiving an external clock signal and the control signal.

If the predetermined external command is inputted from the external, the address latch unit outputs the latched address to output terminal when the control signal is inputted from the control block. But during normal operation, the address latch unit outputs the latched address to output terminal directly.

The clock buffer unit disables the second internal clock signal when the control signal is inputted from the control block. The control block disables the control signal in a predetermined time after the command decoder generates column activation signal according to the control signal.

According to the above configuration, when one command is received, prefetch operation is performed to transmit cell array data to row buffer and then read command is internally enabled to output the data of row buffer to the external.

BRIEF DESCRIPTION OF THE DRAWINGS

The above objects, and other features and advantages of the present invention will become more apparent after reading the following detailed description when taken in conjunction with the drawings.

FIG. 17b is a circuit diagram of delay in the FIG. 17a.

DETAILED DESCRIPTION OF THE DRAWINGS

Figure 1:
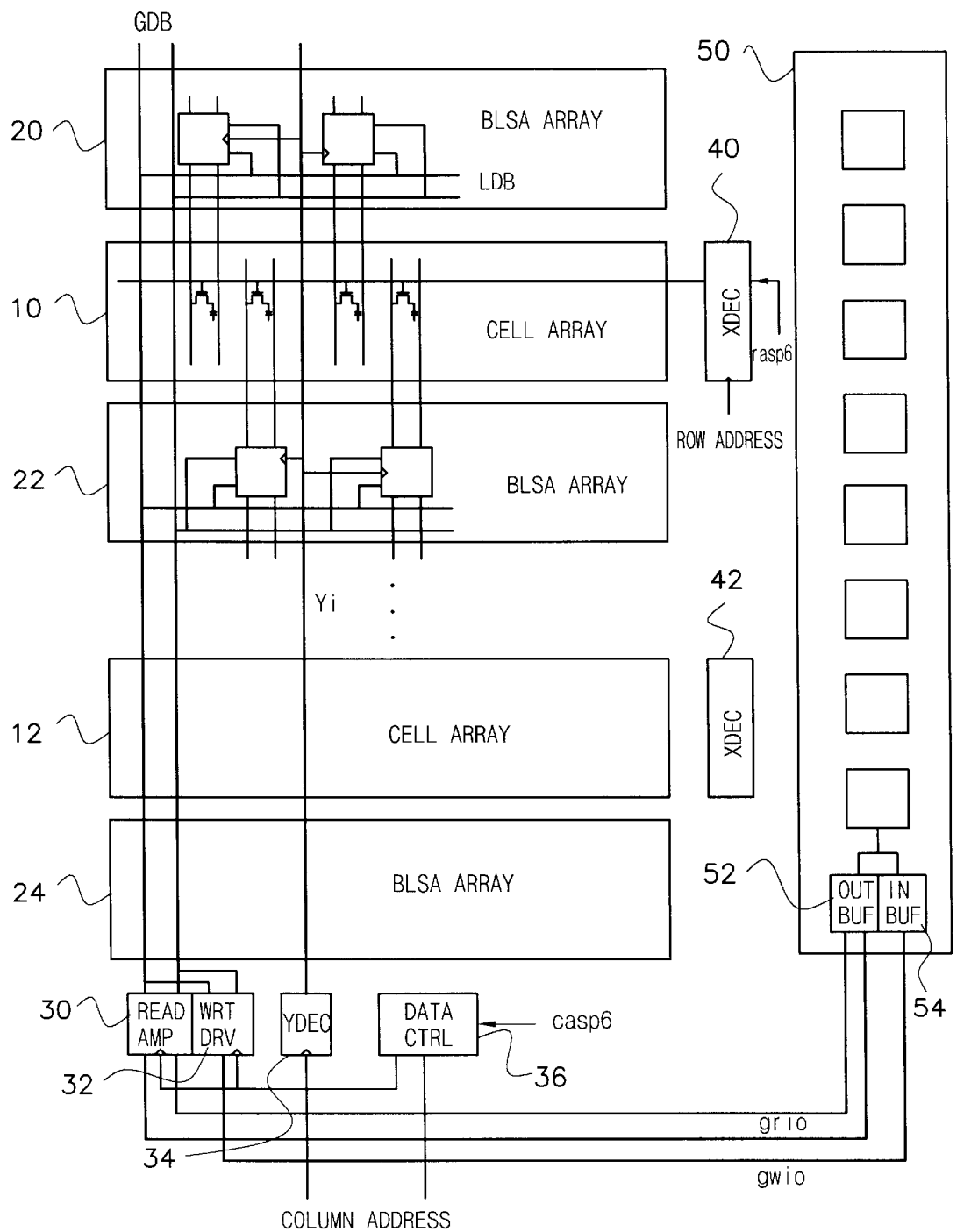
FIG. 1 is a block diagram of conventional SDRAM.
Figure 2:
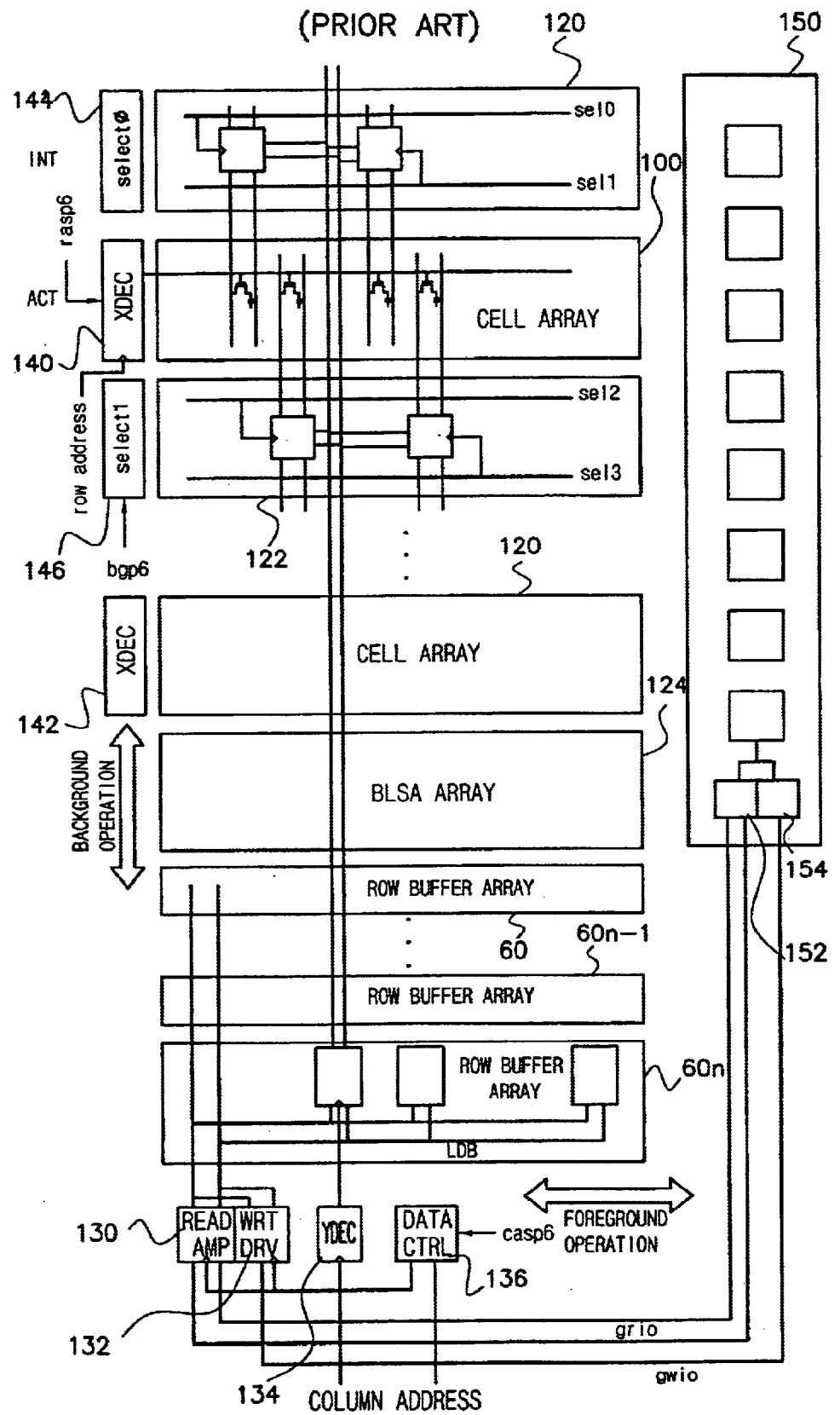
FIG. 2 is a block diagram of conventional DRAM having row buffers.
Figure 3:
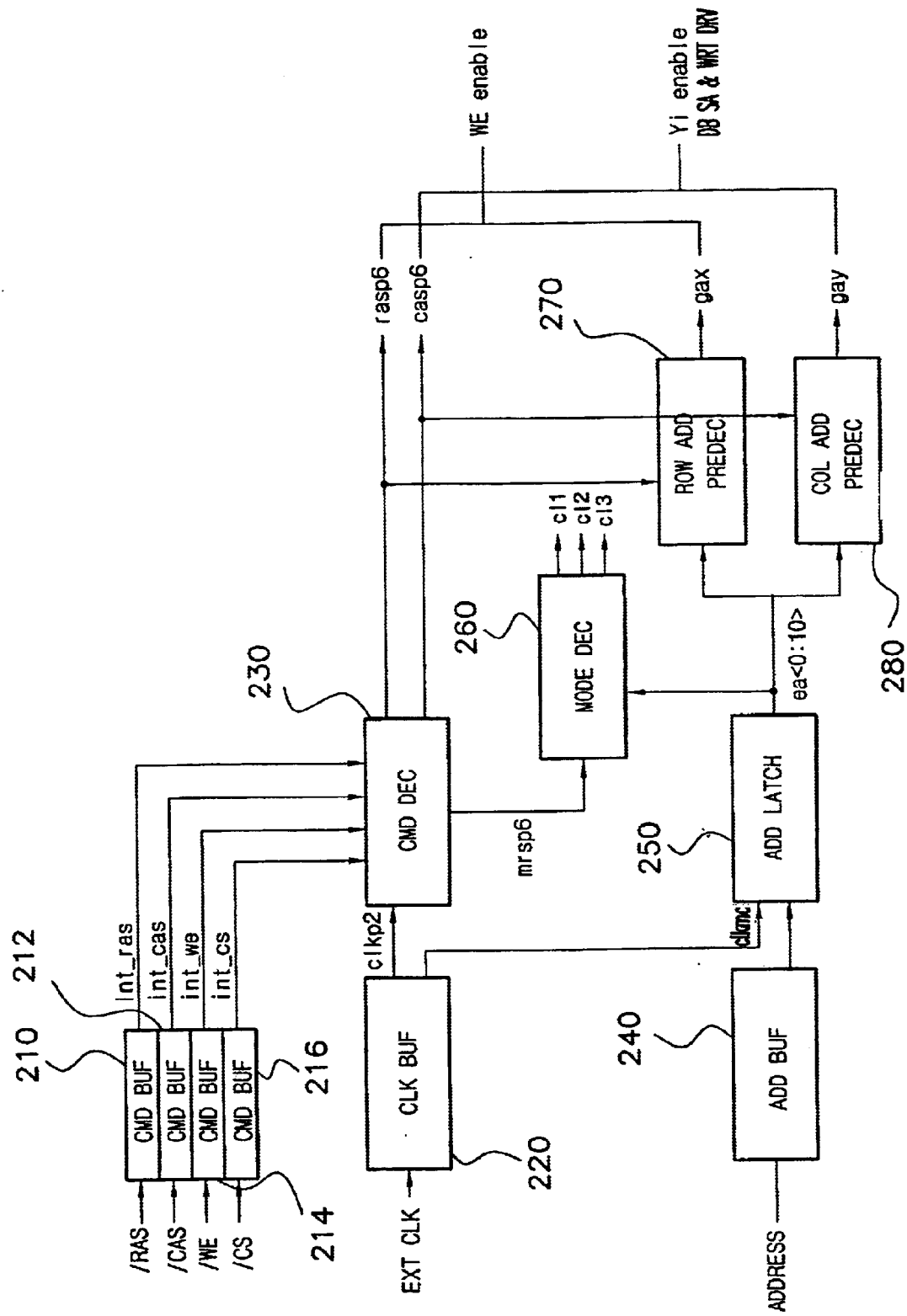
FIG. 3 is a block diagram for showing a state machine of conventional SDRAM.
Figure 4:
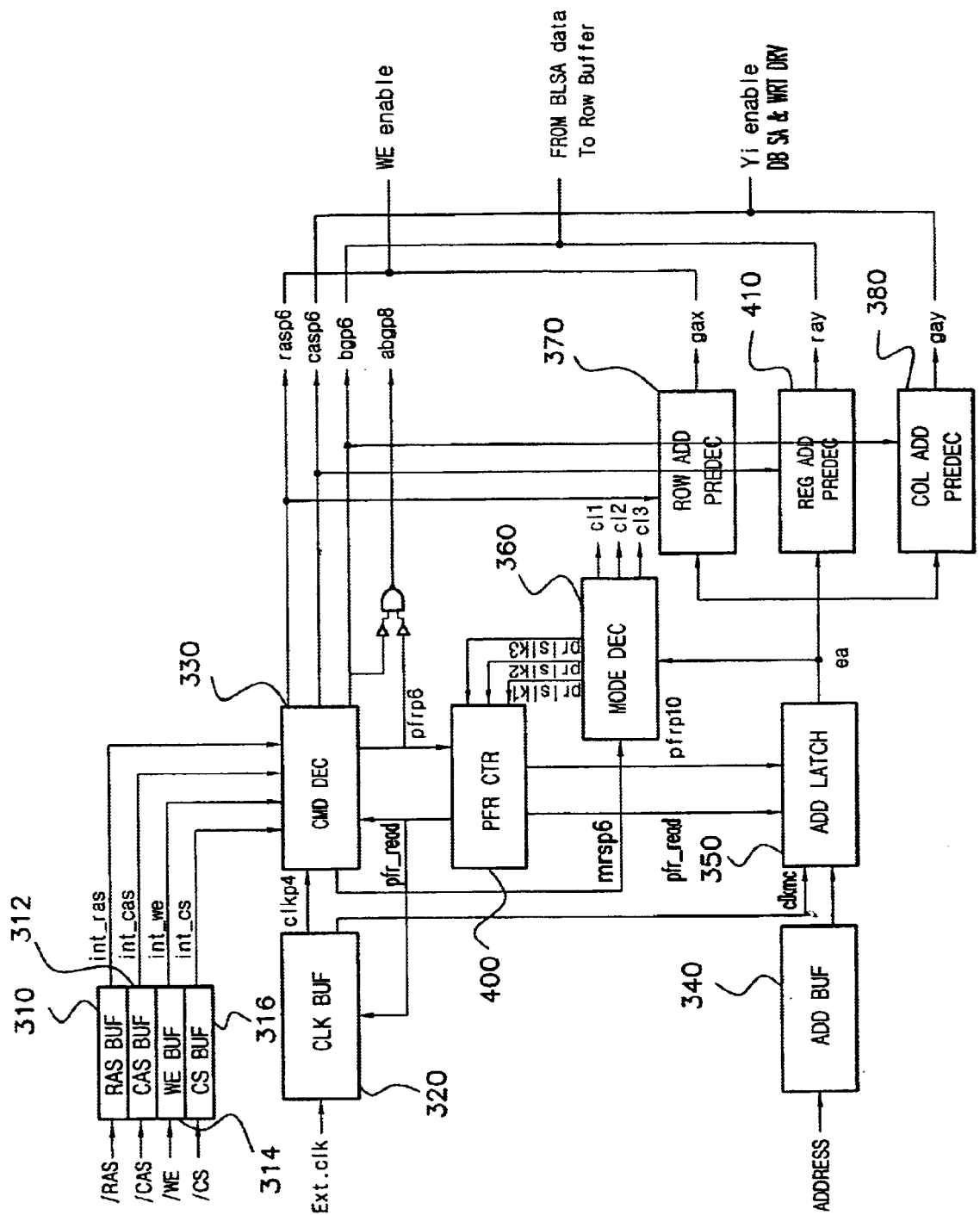
FIG. 4 is a block diagram for showing a state machine having row buffer according to the present invention.

FIG. 4 is a block diagram for showing a state machine of SDRAM having row buffers according to the present invention, comprising clock buffer units 310–320, a command decoder unit 330, an address buffer unit 340, an address latch unit 350, a mode decoder unit 360, a row address predecoder unit 370, a column address predecoder unit 380, a PFR control unit 400 and a register address predecoder unit 410.

The command buffer units 310–316 input /RAS, /CAS, /WE and /CS, respectively. The clock buffer unit 320 inputs external clock CLK and control signal pfr_read and generates internal signals clkp4, clkmc. The command decoder unit 330 inputs internal command signals outputted from the command buffer units 310–316, the output signal clkp4 of the clock buffer unit 320 and the control signal pfr_read and outputs row activation signal rasp6, column activation signal casp6 and internal signals bgp6, pfrp6. The address buffer unit 340 inputs address from the external. The address latch unit 350 latches output signal of the address buffer unit 240 by the output signal of clock buffer unit 320 clkmc and that of the PFR control unit 400 pfr_read, pfrp10. The mode decoder unit 360 inputs the output signal mrsp6 of command decoder unit 330 and the output signal ea of address latch unit 350 and generates cas latency cl1, cl2, cl3 and internal signals prlclk1, prlclk2, prlclk3. The PFR control unit 400 inputs the internal signals prlclk1, prlclk2, prlclk3 of mode decoder unit 360 and the internal signal pfrp6 of command decoder unit 330 and outputs internal signals pfr_read, pfrp10 to the address latch unit 350.

The row address predecoder unit 370 inputs the row activation signal rasp6 and the output signal ea of address latch unit 350 and generates a signal gax activating word line enable signal WE. The column address predecoder unit 380 inputs the output signal bgp6 of command decoder unit 330 and the output signal ea of address latch unit 350 and generates a signal gay activating column selection signal Yi. The register address predecoder unit 410 inputs the column activation signal casp6 and the output signal ea of address latch unit 350 and generates a signal transmitting bit line data to row buffer. And, the NAND gate generates internal signal abgp8 by NAND operating inverted signal of the output signal bgp6 of command decoder unit 330 and that of the output signal pfrp6 of command decoder unit 330.

According to FIG. 4, the PFR control unit 400 and the register address predecoder unit 410 are added to the conventional state machine and the clock buffer unit 320, the command decoder unit 330, the mode decoder unit 360 and the address latch unit 350 have improved structures. In the present invention, cell array data are outputted through row buffer to the external by using Prefetch to Read PFR signal. When PFC command is received, cell array data are temporarily stored in row buffer and then, read command is generated internally to output the data stored in row buffer to the external. The NAND gate generates signal abgp8 enabled in PFC or PFR operation by performing two input of inverted signal of the output signal bgp6 of command decoder unit 330 and that of the output signal pfrp6 of PFR control unit 400.

Therefore, the signal abgp8 is generated to perform PFC operation in PFR operation and then, read operation is performed by generating the signal casp6 internally in a predetermined delay tPCD. The operations are controlled by the PFR control unit 400. And, in order to perform the PFC and read command sequentially in PFR operation, row buffer address is stored in PFC operation and transmitted when read command is generated. The cell array data of SDRAM are outputted according to column decoder output signal Yi generated by column address. The cas latency CL=1,2,3 is determined by the time that the column active signal casp6 is activated and data are outputted. The column active signal casp6 is generated in the clock inputting read command and internally in PFR operation. And, the clock is generated in one clock clk or two clock clk. When the column active signal casp6 is activated and data are outputted in the next clock, cas latency CL is '1' and when data are outputted in the second clock, CL is '2', and when data are outputted in the third clock, CL is '3'.

Figure 5:
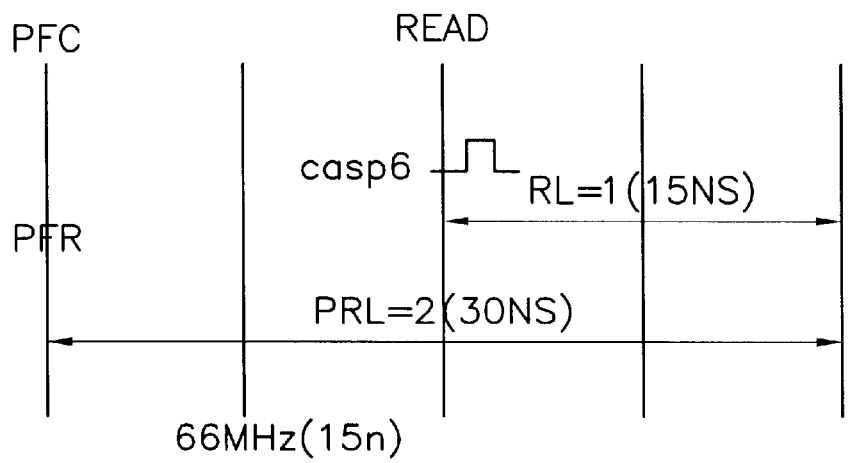
FIGS. 5 to 10 are diagrams for showing relation of latency to read operation PRL from cas latency CL of a conventional SDRAM, read latency RL of the present invention and prefetch operation, wherein RL=1 and PRL=2 in the FIG. 5,
RL=1 and PRL=3 in the FIG. 6,
RL=2 and PRL=3 in the FIG. 7,
RL=2 and PRL=4 in the FIG. 8,
RL=3 and PRL=5 in the FIG. 9, and
RL=3 and PRL=6 in the FIG. 10.
Figure 5:
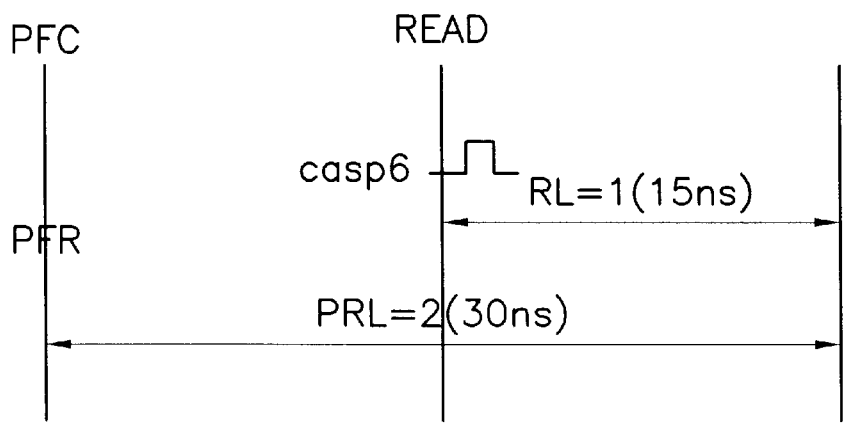
Figure 6:
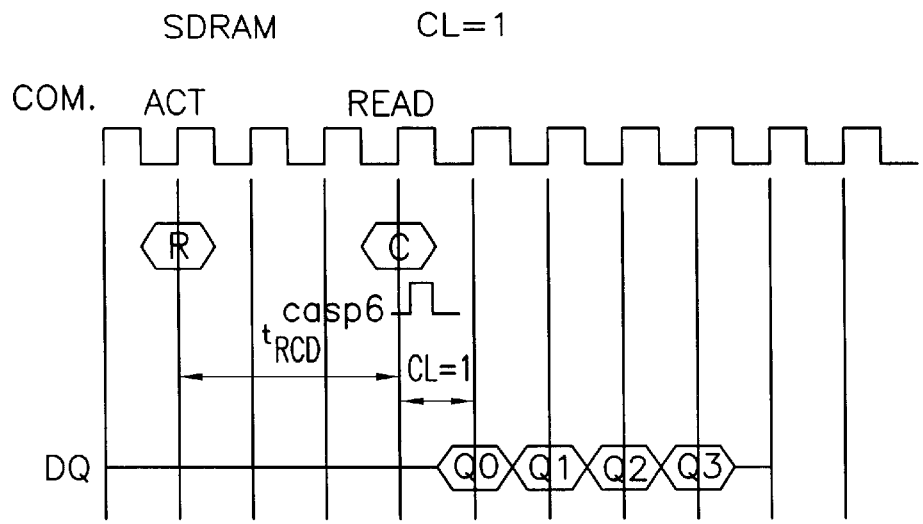
Figure 6:
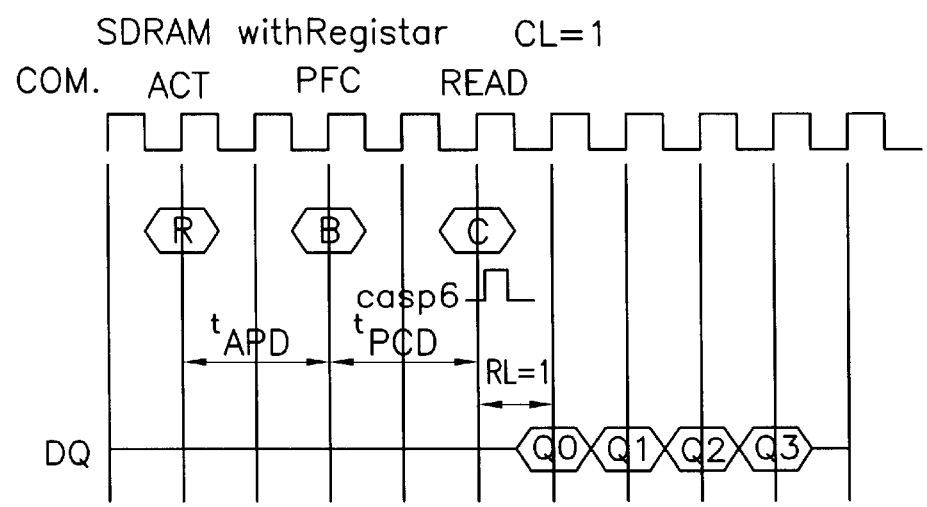
Figure 6:
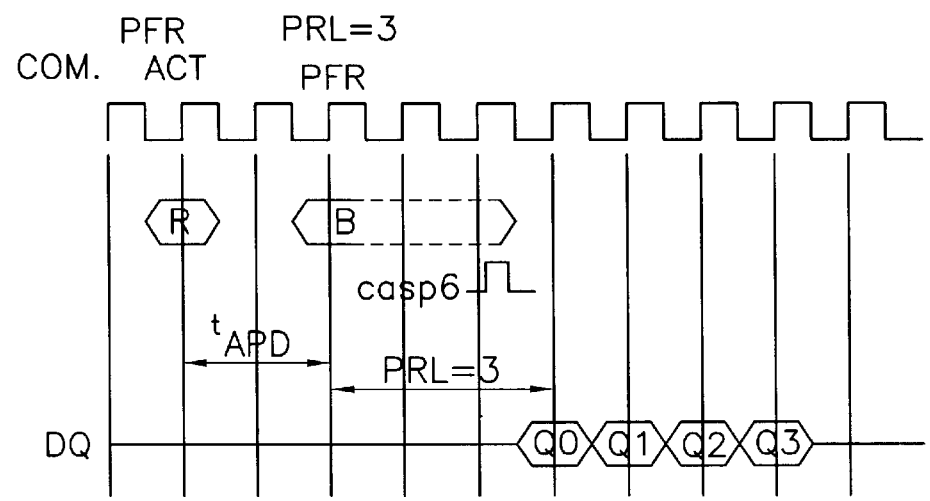
Figure 7:
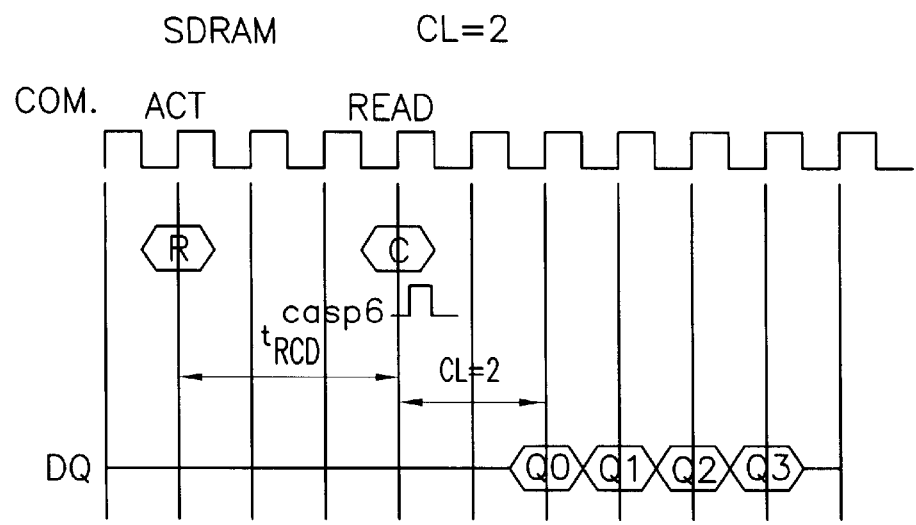
Figure 7:
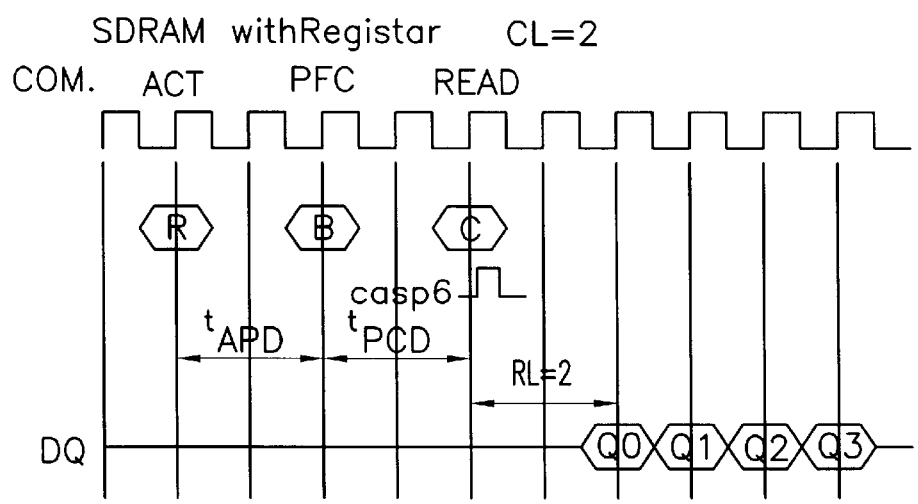
Figure 7:
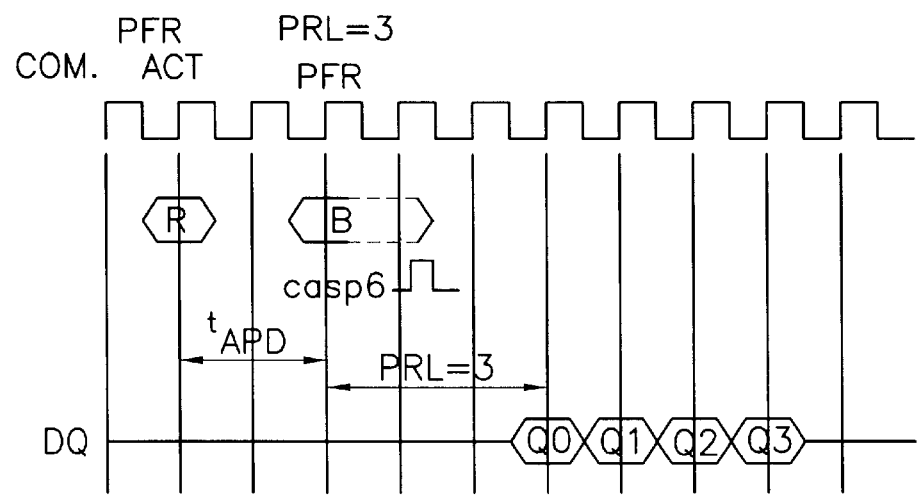
Figure 8:
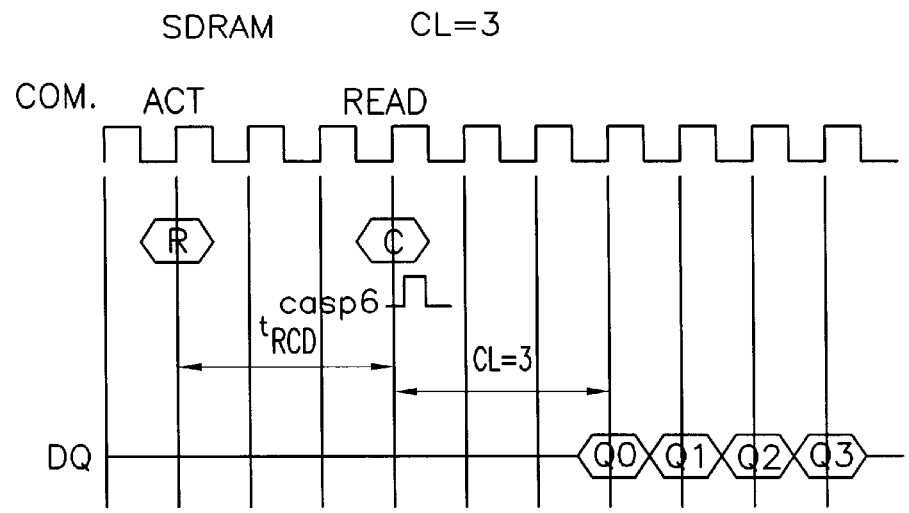
Figure 8:
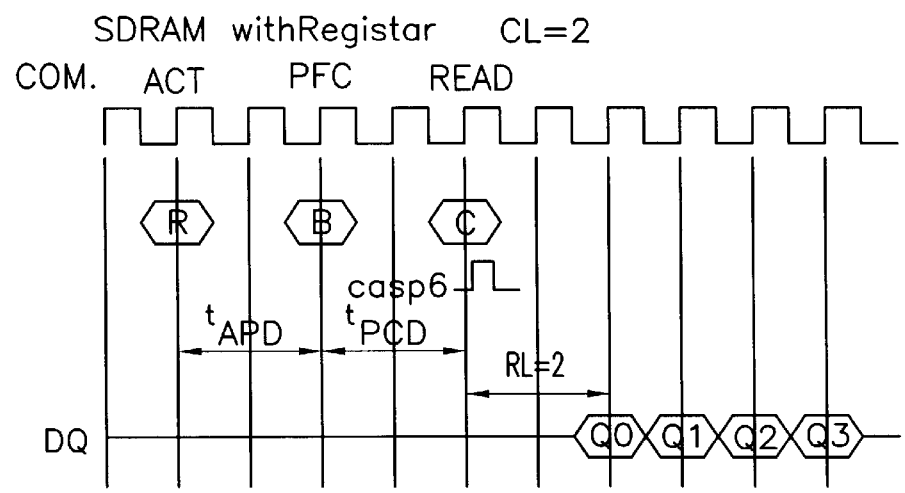
Figure 8:
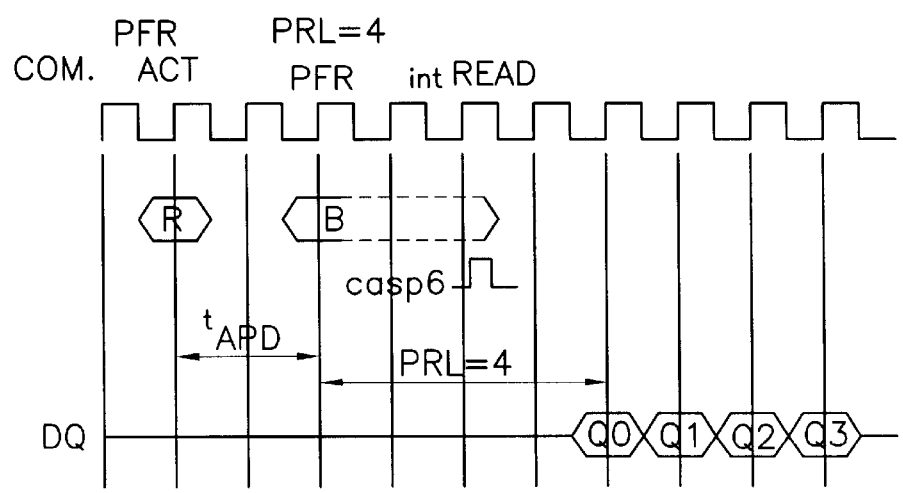
Figure 9:
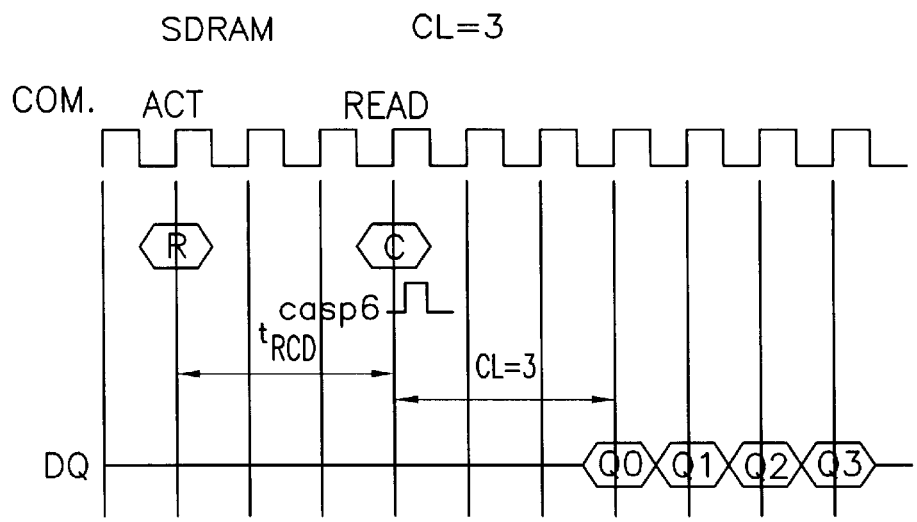
Figure 9:
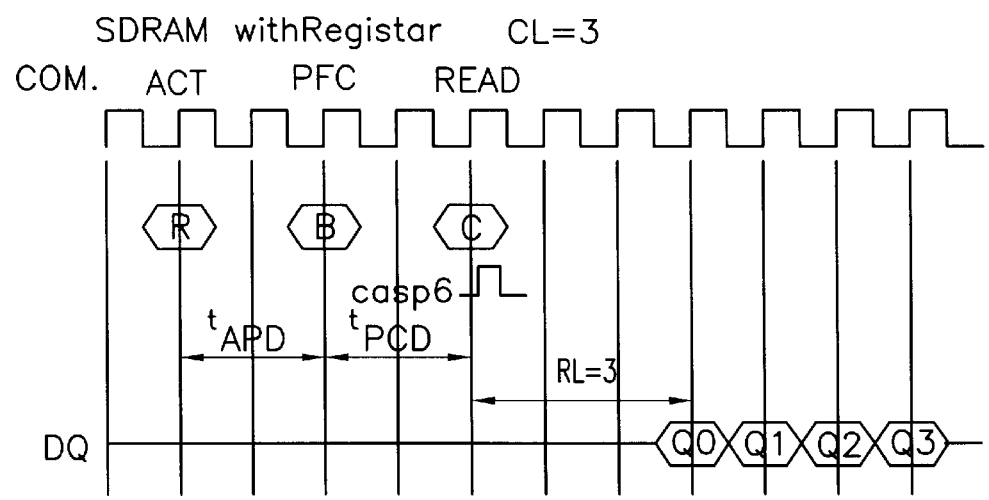
Figure 9:
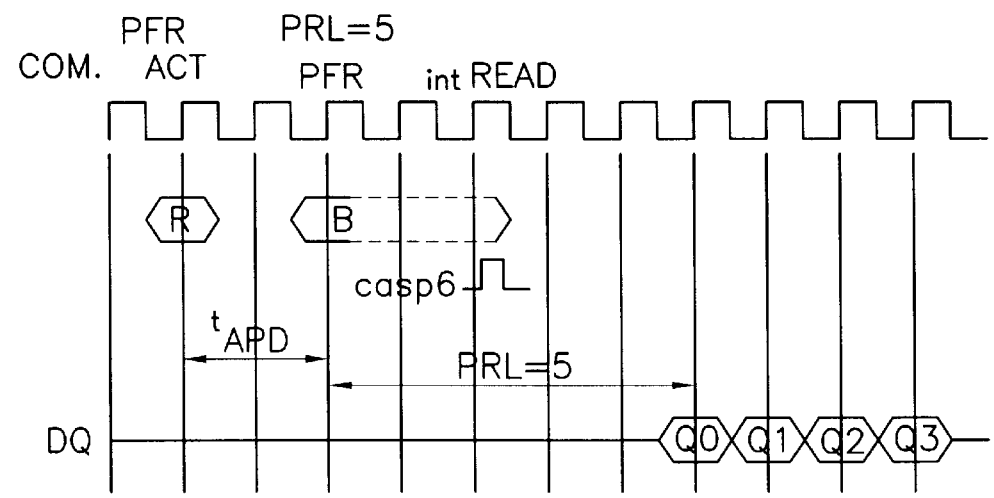
Figure 10:
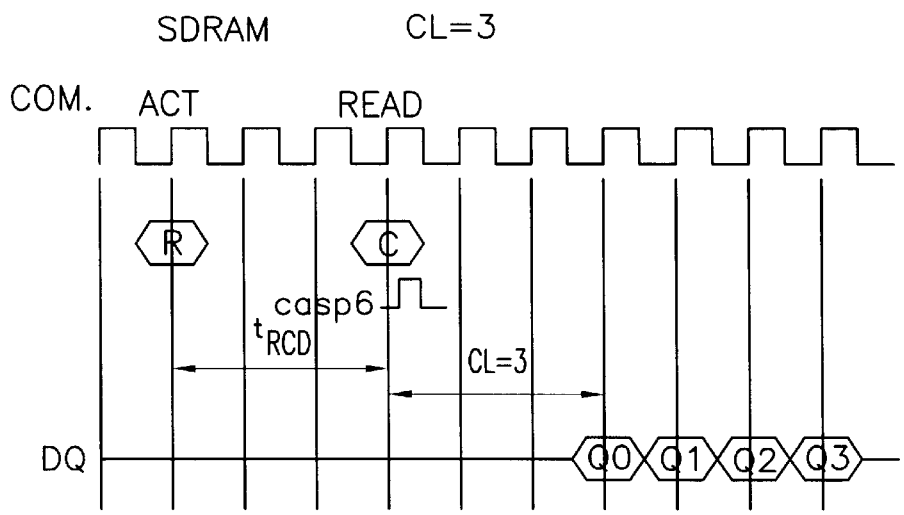
Figure 10:
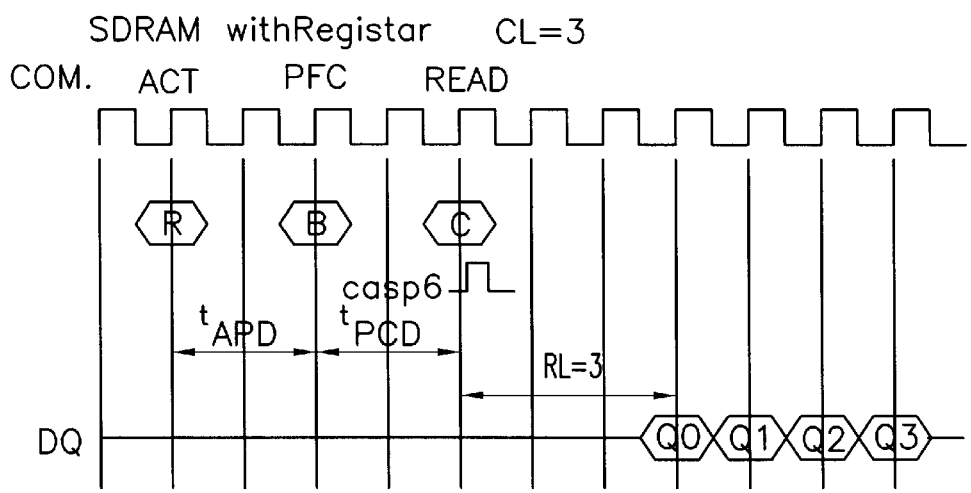
Figure 10:
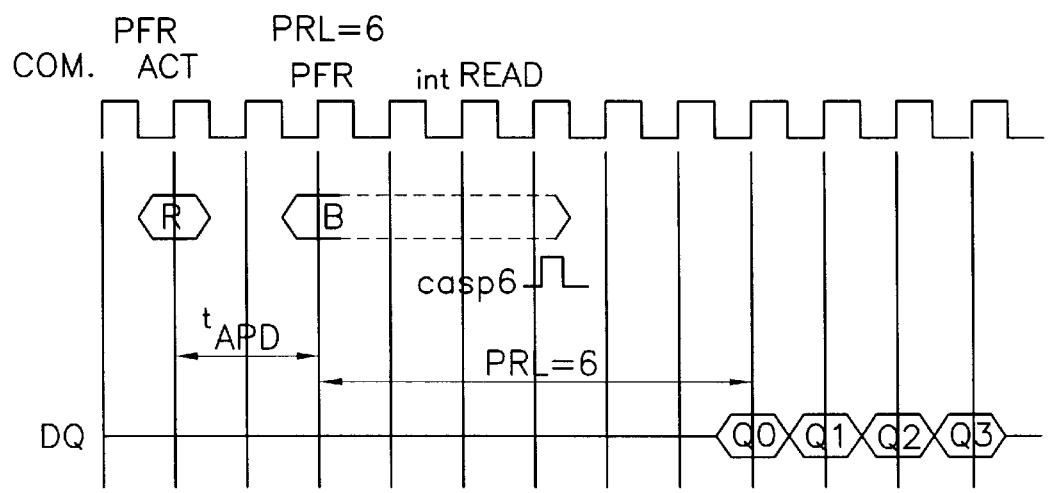

FIGS. 5 to 10 are diagrams for showing relation of latency PRL in cas latency CL of SDRAM, read latency RL of the present invention and PFR operation. FIG. 5 shows the case that RL=1 and PRL=2. In this case, data are outputted in the clock generating casp6 since the clock period is long. FIG. 6 shows the case that RL=1 and PRL=3. In this case, casp6 is internally generated in two clock after PFR and data are outputted after one clock. FIG. 7 shows the case that RL=2 and PRL=3. In this case, data are outputted in 2clk after casp6 in PFR and read command and in PFR. However, in PFR operation, casp6 is outputted internally after 1 clk. FIG. 8 shows the case that RL=2 and PRL=4. In this case, data are outputted in 2clk after casp6 is activated. FIG. 9 shows the case that RL=3 and PRL=5. In this case, data are outputted in 3clk after casp6 is activated. FIG. 10 shows the case that RL=3 and PRL=6. In this case, data are outputted in 3clk after casp6 is activated. However, in PFR, casp6 is generated internally after 3clk.

In order to decode latency corresponding to each case, RL and PRL are divided according to clock from the point activating casp6 in PFR. When RL=1, PRL=2 and RL=2, PRL=3, casp6 is generated after one clock in PFR operation. When RL=1, PRL=3 and RL=2, PRL=4 and RL=3, PRL=5, casp6 is generated after two clock in PFR operation. When RL=3 and PRL=6, casp6 is generated after three clock. Therefore, the six cases are divided into the above three cases.

Figure 11:
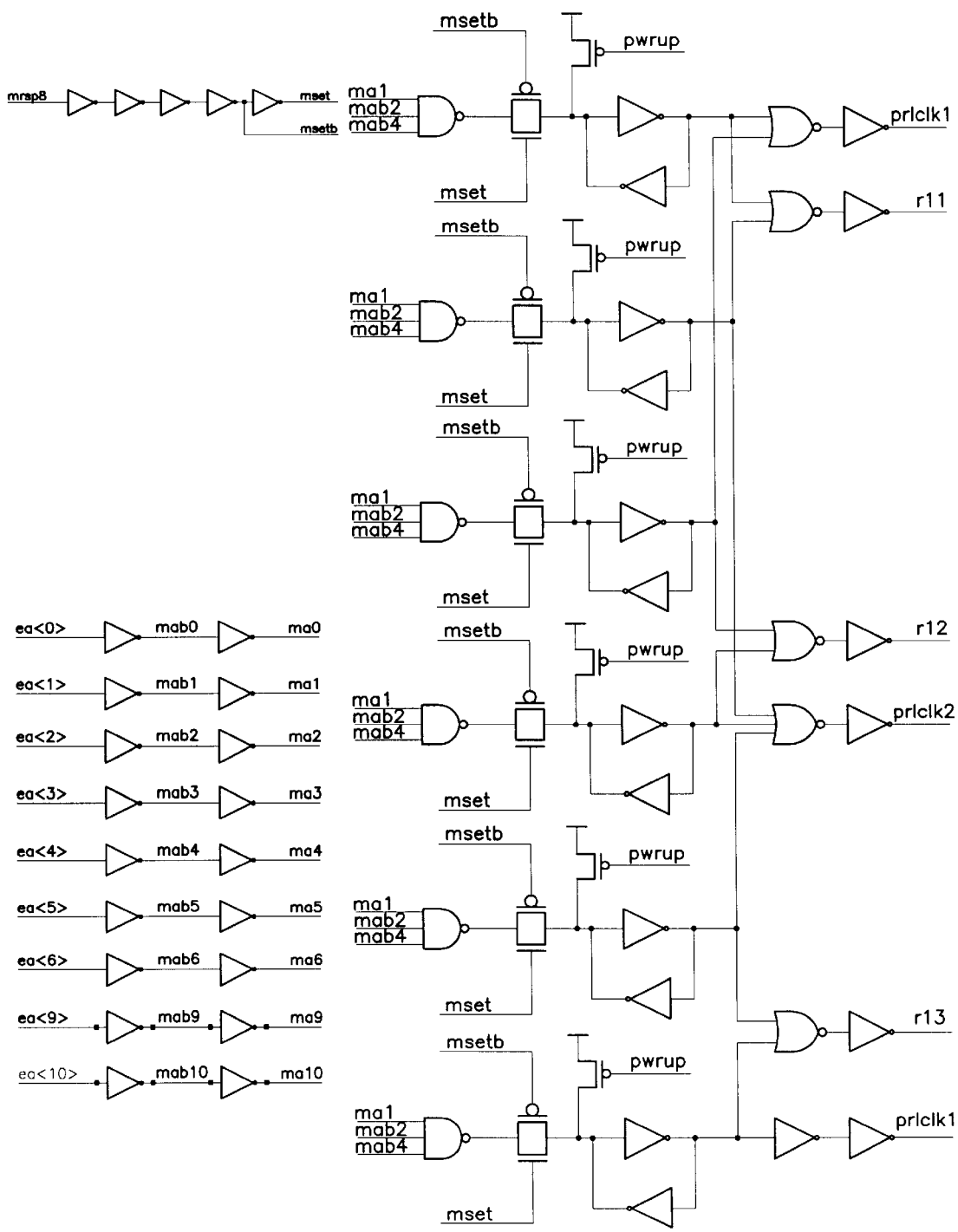
FIG. 11 is a circuit diagram of mode decoder according to the present invention.

FIG. 11 shows the process for receiving the signal mrsp6 generated from command decoder in mode register set by mode decoder and programming CAS latency according to corresponding address. In this process, RL1, RL2 and RL3 are generated by three addresses 1,2 and 4. In each case, according to the order of A4, A2 and A1, RL=1 and PRL=2 in 001 and RL=1, PRL=3 in 101 and RL=2, PRL=3 in 010 and RL=2, PRL=4 in 110 and RL=3, PRL=5 in 011 and RL=3, PRL=6 in 111. The six cases are divided into the following three cases according to the time of internally generating casp6 signal in the PFR operation. When the casp6 signal is generated after 1 clock, it is prlclk1, when after 2 clock, prlclk2 and when after 3 clock, it is prlclk3.

Figure 12:
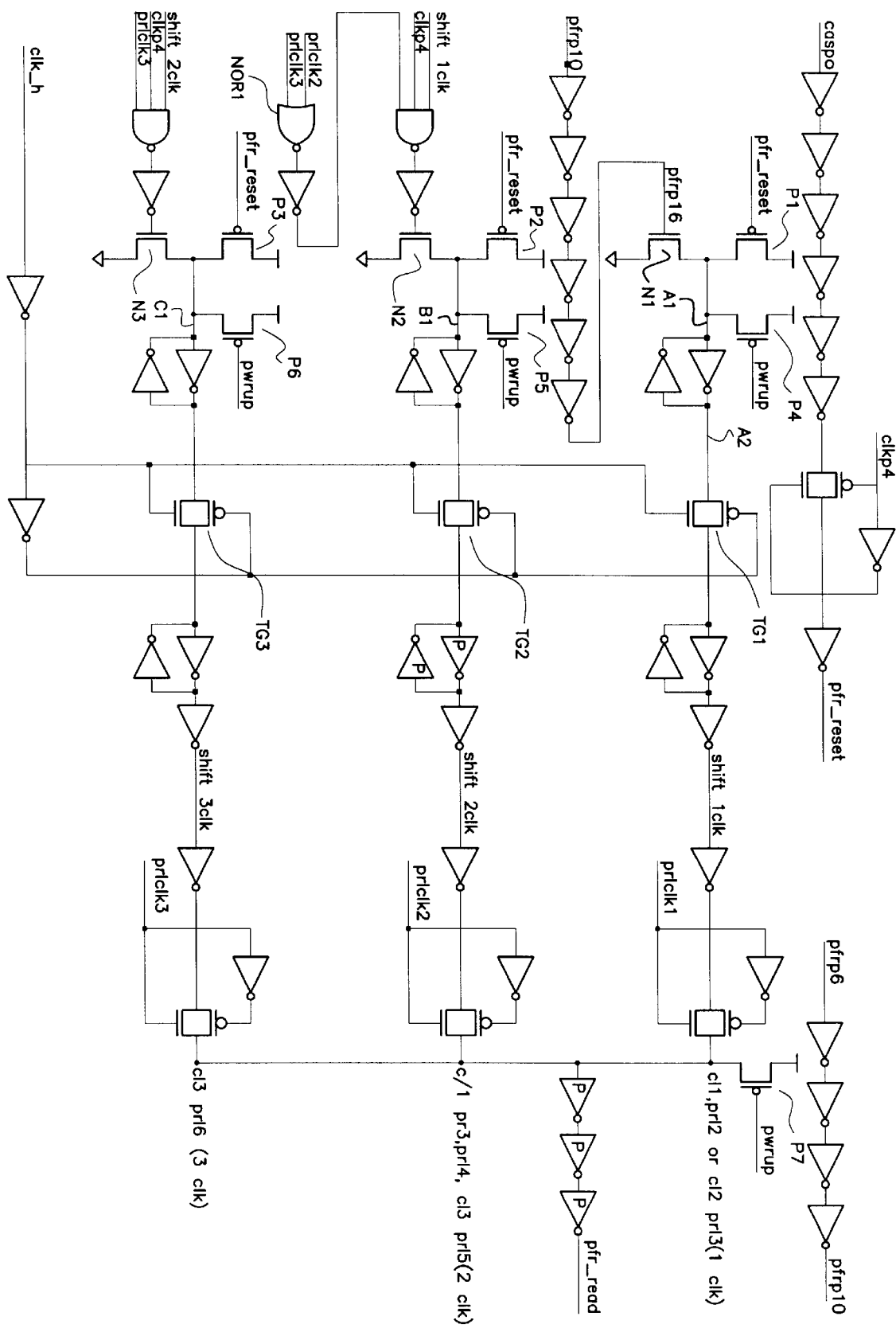
FIG. 12 is a circuit diagram of PFR control unit generating column active signal in PFR command according to the present invention.

FIG. 12 is a circuit diagram of PFR control unit 400 generating column active signal casp6 in PFR command according to the present invention. Generally, it is employed to determine when the casp6 signal is internally generated after PFR command and to generate pfr_read command by receiving prlclk1, prlclk2 and prlclk3 signals.

When the PFR command is received, a pulse signal prfp6 is generated in the command decoder and the signal drives NMOS transistor N1 through 10 inverters, thereby setting a node A1 'low'. The signal of node A1 is transmitted to a node A2 through 1 inverter, thereby setting the signal of node A2 'high'. And, transmission transistor TG1 is turned on in a falling edge of the next clock clk_h, thereby setting a node shift_1clk 'high'. The node shift_1clk activates the output signal pfr_read only when the control signal prlclk1 is 'high'.

And, the node shift_1clk is inputted in the lower block, thereby generating signal to a node shift_2clk of the next clock. The signal of node shift_2clk is generated when one of two input signals prlclk2, prlclk3 inputted into NOR gate NOR1 is enabled. And, when the input signal prlclk3 is enabled, signal is generated to a node shift_3clk. The output signal pfr_read is disabled by turning on PMOS transistors P1, P2, P3 when the pfr_reset signal is enabled 'low'. The power up signal pwrup is employed by gate input of the PMOS transistors P4~P7, for setting initial value of the node A1, B1, C and D1. The power up signal pwrup is initially 'low' and sets the node 'high', thereby turning off the PMOS transistors P4~P7 of 'high' state.

Figure 13:
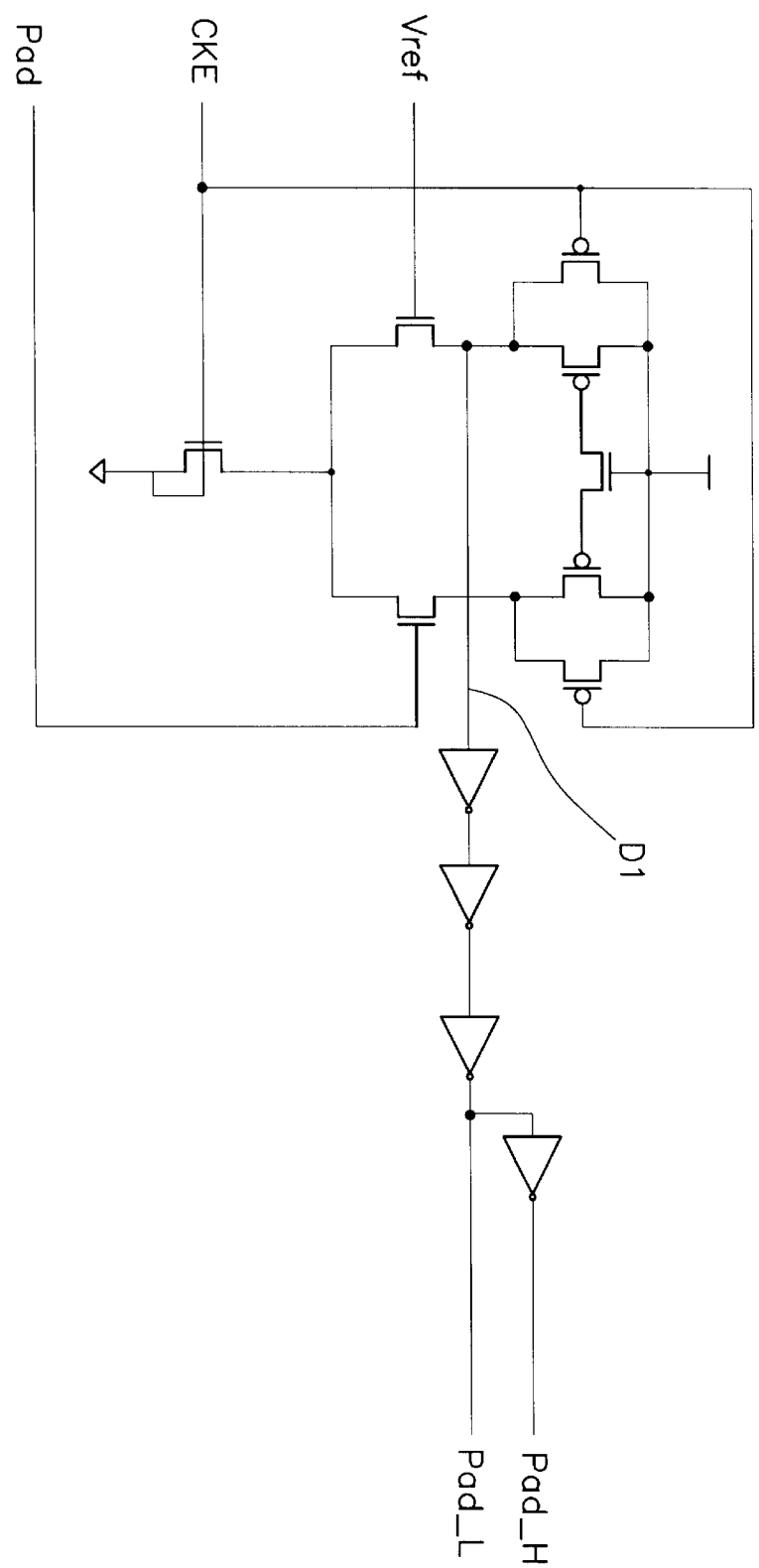
FIG. 13 is a circuit diagram of command buffer according to the present invention.

FIG. 13 is a circuit diagram of command buffer units 310~316 according to the present invention. They are employed to buffer /RAS, /CAS, /WE and /CS signals and to output the result of comparing the command signal and the reference voltage Vref:1.4V to the node D1 when a clock enable signal cke is 'high'. When the command signal is lower than the reference voltage Vref, the node D1 is 'low', thereby setting the signal Pad_L 'high' and the signal Pad_H 'low'. When the command signal is higher than the reference voltage Vref, the node D1 is 'high', thereby setting the signal Pad_L 'low' and the signal Pad_H 'high'.

Figure 14:
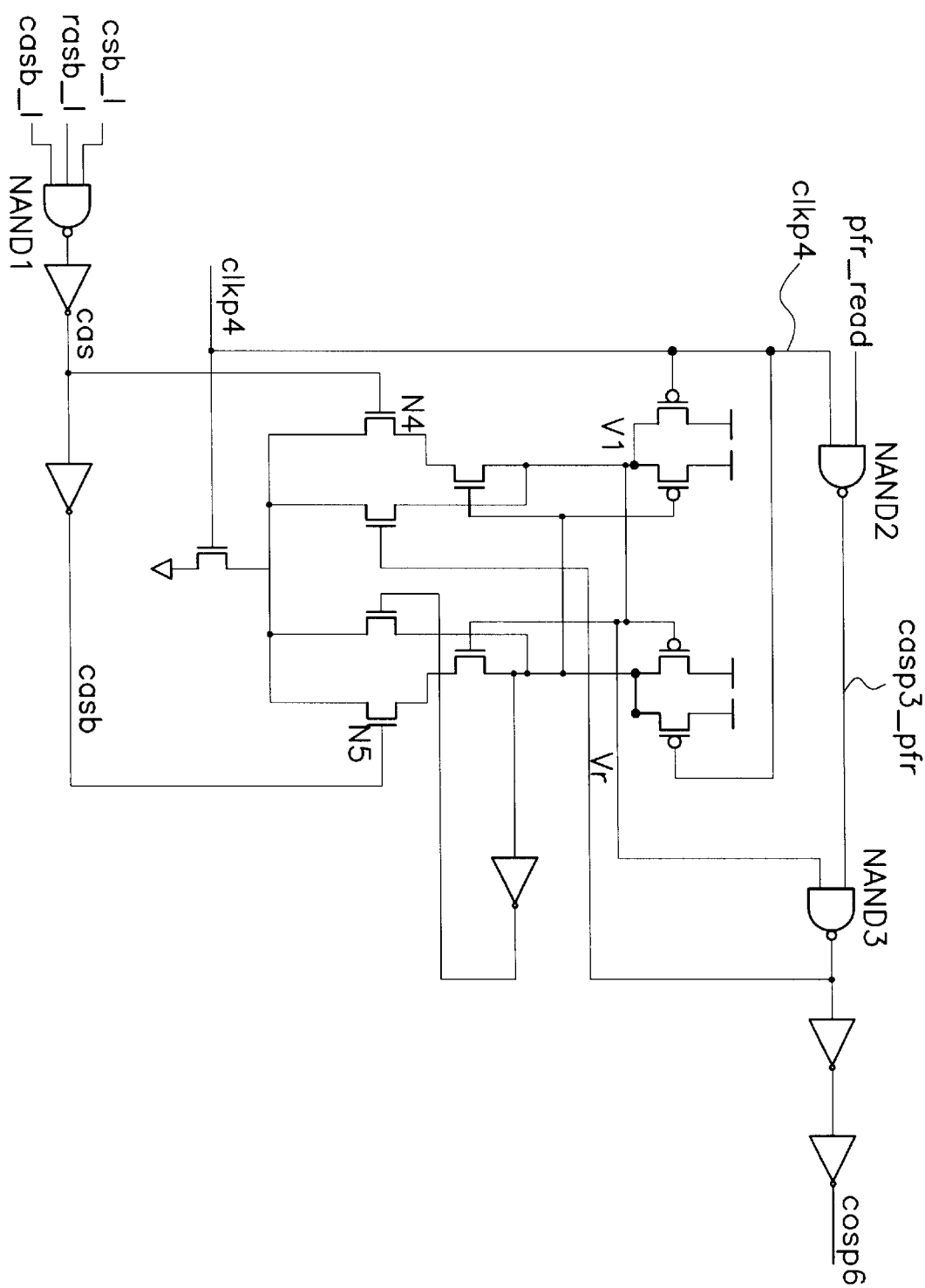
FIG. 14 is a circuit diagram of command buffer latch according to the present invention.

FIG. 14 is a circuit diagram of command buffer latch according to the present invention. The latch is employed to clock output signals of the command buffer units 310~316 by the output signal clk4 of clock buffer unit 320. FIG. 14 shows the generation of rasp6 signal by active command ACT, bgp6 signal in PFR operation and mrs6 signal in mode resist set signal MRS. The operations thereof are controlled by combination of /RAS, /CAS and /CS signals received to NAND gate NAND1. Referring to FIG. 14, when output signal csb_L of /RAS buffer is 'high', output signal rasb_H of /CAS buffer 'high' and output signal casb_L of /CS buffer 'high' (that is, /RAS=L, /CAS=L, /CS=L), the signal cas is 'high' and the signal casb is 'low' in rising edge of clock clkp4. Therefore, NMOS transistor N4 is turned on and NMOS transistor N5 is turned off, thereby setting node V1 'low'. Therefore, output of NAND gate NAND3 is 'high' and output signal casp6 is enabled. The signal pfr_read is inputted to the NAND gate NAND2 in order to generate signal casp6 when read command is received from the external and to generate the signal in PFR operation. That is, when the signal pfr_read is 'high', the signal casp6 is generated in a rising part of clock clkp4.

Figure 15:
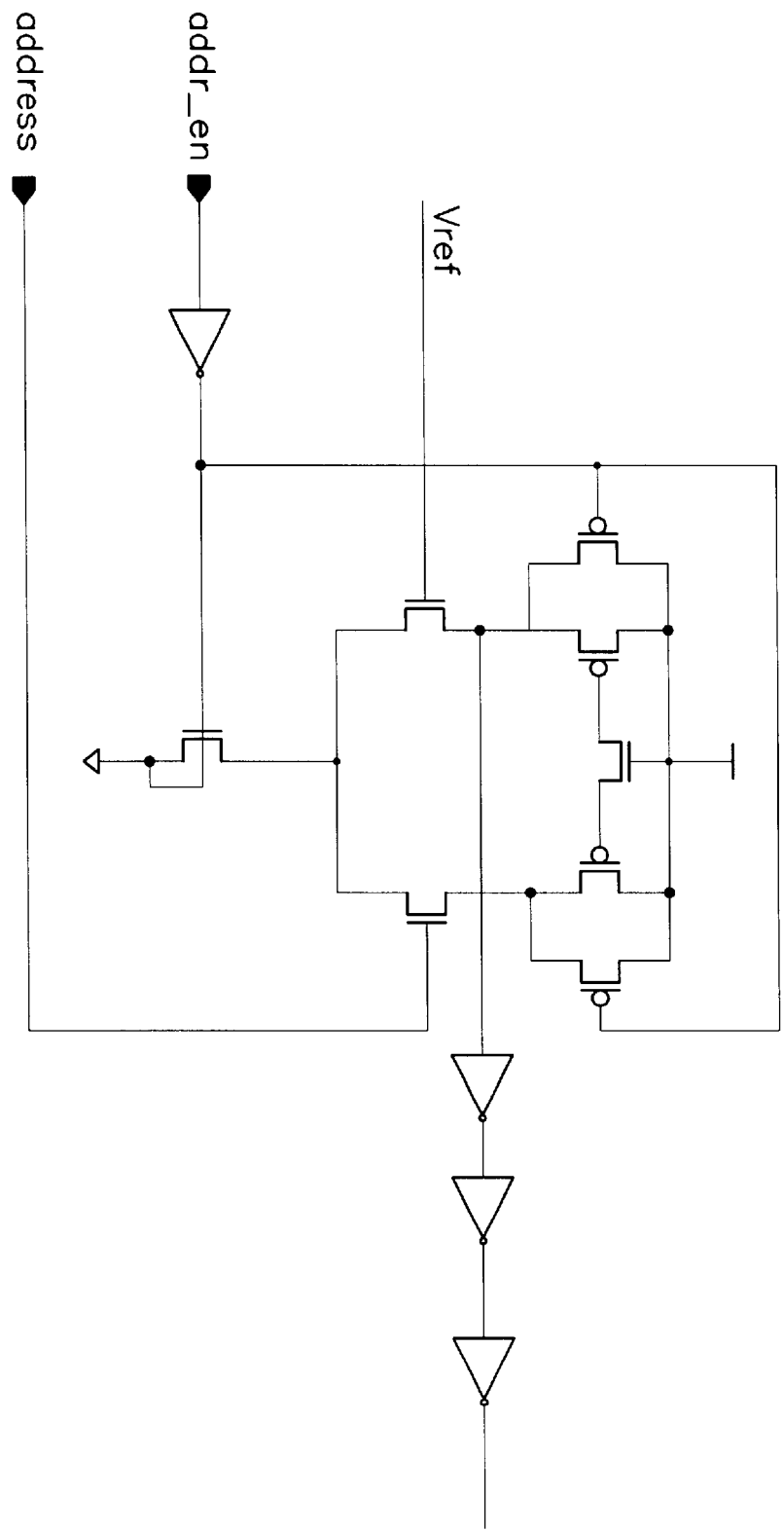
FIG. 15 is a circuit diagram of address buffer according to the present invention.

FIG. 15 is a circuit diagram of address buffer unit 340 according to the present invention, comprising amplification circuit for comparing and amplifying address signal and reference voltage.

Figure 16:
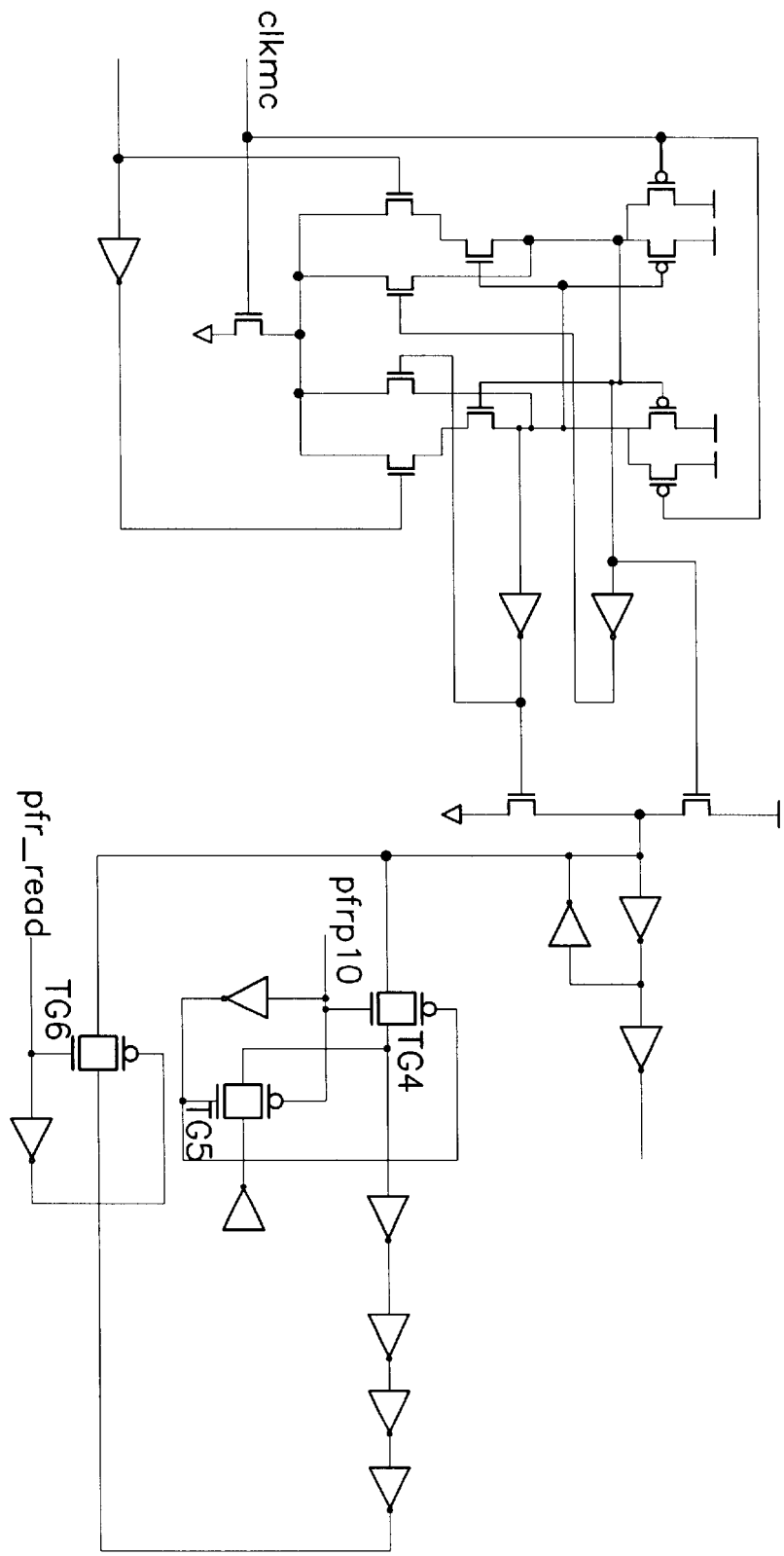
FIG. 16 is a circuit diagram of address buffer latch according to the present invention.

FIG. 16 is a circuit diagram of address latch unit 350 according to the present invention, for receiving address from rising edge of internal clock signal clkmc and latching data. In a normal operation, the latched address is outputted. However, in PFR operation, column address signal is inputted since read command is not received. The column address signal is not required in PFR operation since background PFC operation is generated, however, it is required when the internal signal casp6 is generated. Here, it is difficult to maintain the column address signal received in PFR operation for longer than one clock time tCK and to latch continuously. Therefore, the address latch unit of the present invention has been made to continuously latch data in PFR operation.

Figure 17A:
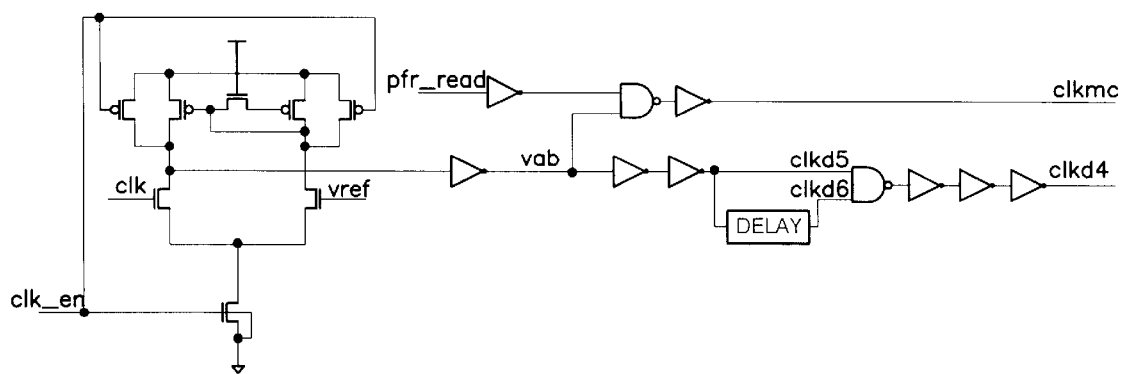
FIG. 17a is a circuit diagram of clock buffer according to the present invention.
Figure 17B:
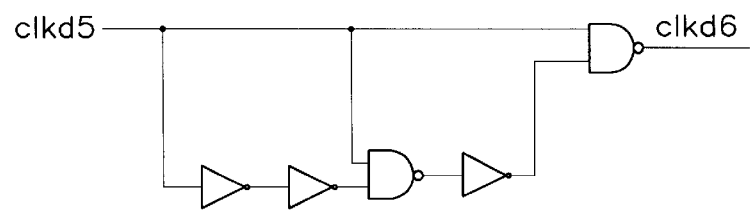

FIG. 17a is a circuit diagram of clock buffer unit 320 according to the present invention. When clock enable signal clk_en is 'high', internal clock is generated by comparing the signal with reference voltage Vref:1.4V. The signal clkp4 is employed as a practical internal clock and the signal clkmc is to synchronize the address buffer. Here, when the internal signal casp6 is activated, the signal clkmc is not enabled. FIG. 17b is a circuit diagram of delay in the FIG. 17a, comprising 3 inverters and 2 NAND gates. Referring to FIG. 17b, it comprises: a first and a second inverters connected to each other in a series, for receiving the signal clkd5 and generating a signal delayed for a predetermined time; a first NAND gate for 2 inputting the signal clkd5 and output signal of the second inverter; a third inverter for receiving output signal of the first NAND gate and generating the inverted signal; and a second NAND gate for 2 inputting the signal clkd5 and output signal of the third inverter and generating a signal clkd6.

Figure 18:
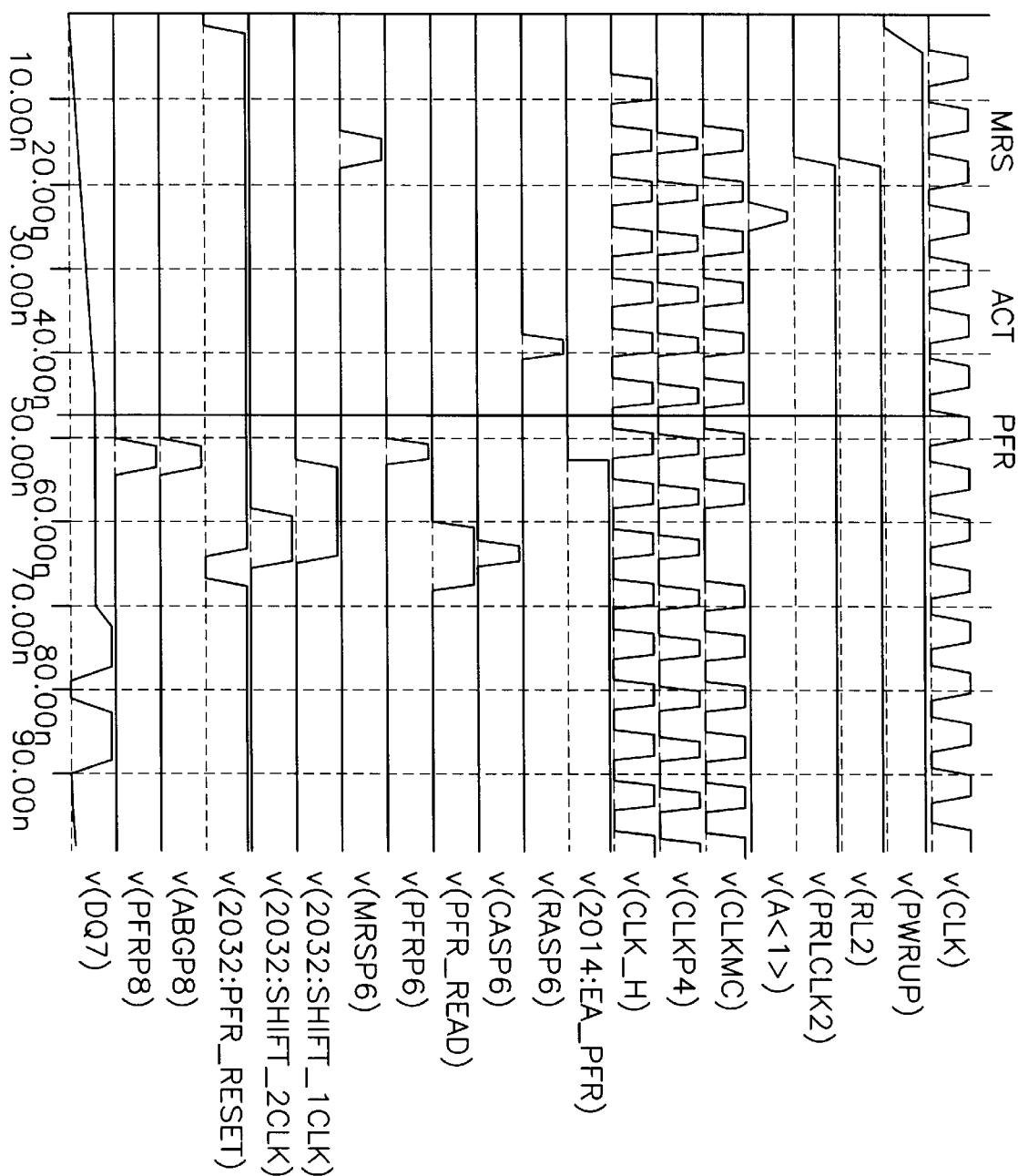
FIG. 18 is a diagram for showing an operation timing of PFR operation according to the present invention.

FIG. 18 is a drawing for showing an operation timing of PFR according to the present invention. Referring to the FIG. 18, MRS command, ACT command and PFR command are sequentially applied. The power up signal pwrup is initially 'low' and therefore, initial values of each node are 'high', thereby determining RL2 signal and prlclk2 signal in MRS command. It is determined by address applied from the external in MRS command (RL2, PRL4). The clock buffer generates clk_h, clkmc and clkp4 as internal clocks. Then, the rasp6 is enabled by active command ACT, thereby activating word lines and increasing potential of bit line and bit line bar. And, when PFR command is received, bgp6 is not activated and pfrp6 is activated differently from PFC, thereby activating abgp8. Therefore, data of bit line sense amp are loaded to transmission bus to load on row buffer. Although read command is not received from the external, prlclk2 signal is activated by pfr_ctrl circuit and shift_1clk and shift_2clk signals by pfrp6 signal, thereby activating pfr_read signal. The casp6 is activated by the pfr_read signal in command latch. As a result, the column address received in PFR is latched by pfrp10 signal (ea_pfr='high') and when the pfr_read signal is enabled, clkmc signal synchronizing the address latch is disabled and then the column address signal is generated by the pfr_read signal. And, column decoder output signal Yi is enabled by the column address signal, thereby outputting data.

To sum up, according to the conventional DRAM having row buffer compatible with SDRAM, two commands are inputted due to the separation of cell array and input/output (I/O). However, according to the present invention, cell array data are outputted to data output buffer through row buffer by one command. Therefore, Prefetch to Read PFR operation signal is generated to sequentially perform prefetch operation and read operation. And, the bgp6 signal is internally generated in PFC operation to be activated in PFR operation and the casp6 signal is internally generated. The CAS Latency CL is a time from input of read command to output of effective data, being n times of clock cycle time. And, the CAS latency indicates tCAA by a unit of clock cycle time. Therefore, when system clock frequency is increased, tCLK is decreased and tCLK corresponding to tCAA is increased, thereby increasing the CAS latency. And, when CAS command is inputted by mode register set MRS, the CAS latency is controlled by SDRAM. The clock latency of SDRAM is 1,2 or 3 and it is the same to DRAM having row buffer.

According to the present invention, it is impossible to employ CAS latency of conventional SDRAM since read command is not inputted in Prefetch to Read command PFR. Therefore, instead of conventional CAS Latency CL, PFR operation signal is employed and Read Latency RL is employed as the conventional CL. If the delay from ACT to read command is referred to as tRCD and that from read command to first data is CAS latency, tRCD=3clk and CL=3 in the conventional SDRAM. And, according to the conventional SDRAM, it is difficult to maintain CL=2 in high frequency. However, according to the present invention, it is not required to read cell array in reading row buffer. Therefore, loading and data path are decreased. As a result, it is possible to maintain CL=2, tAPD=2clk, tPCD=2clk and RL=2. Here, tAPD indicates a delay from ACT command to PFR command in DRAM having row buffer and tPCD indicates a delay from PFR command to read command. And, the present invention has been made to send data in consideration of a time RL generating the first data by two commands PFC, Read or only Read command and a time PRL generating the first data by only PFR command.

AS described above, according to the present invention, when one command signal is received, cell array data are stored in row buffer by prefetch operation and then the data of row buffer are outputted to the external by internally enabling read command, thereby simplifying commands. Accordingly, it is effective to perform SPEC and decrease unnecessary commands.

Although the preferred embodiment of this invention has been disclosed for illustrative purpose, those skilled in the art will appreciate that various modifications, additions and substitutions are possible, without departing from the scope and spirit of the invention.

What is claimed is:

1. A semiconductor memory device having a row buffer and being compatible with a SRAM, the semiconductor memory device comprising:
    a memory cell array for storing data;
    the row buffer for storing data of a row of the memory cell array; and
    a state machine for controlling the semiconductor memory device to firstly store data of the row determined by an inputted address signal from the memory cell array in the row buffer when a single predetermined external command is inputted from the external, and then to output a part of the data according to the address signal from the row buffer to the external in a predetermined delay time, wherein the part of the data are outputted to the external through the row buffer by one predetermined external command.

2. A semiconductor memory device, comprising:
    a memory cell array for storing data;
    a row buffer for storing data of a row of the memory cell array; and
    a state machine for controlling the semiconductor memory device to firstly store data of the row determined by an inputted address signal from the memory cell array in the row buffer when a predetermined external command is inputted from the external, and then to output a part of the data according to the address signal from the row buffer to the external in a predetermined delay time, wherein the state machine comprises:

a command decoder for generating column activation signal, mode register set signal and first internal command signal;

a mode decoder for generating mode signals determining the generation time of column activation signal according to corresponding address signal when the mode register set signal is inputted from the command decoder; and a control block for generating control signal which controls the command decoder to generate the column activation signal at the time determined by the mode signals when the first internal command signal is inputted from the command decoder according to the input of the predetermined external command.

3. The semiconductor memory device according to claim 2, wherein the state machine further includes:

an address latch unit for latching address signal inputted from the external; and a clock buffer unit for generating a first internal clock signal for synchronizing the command decoder and a second internal clock signal for synchronizing the address latch unit by receiving an external clock signal and the control signal.

4. The semiconductor memory device according to claim 3, wherein if the predetermined external command is inputted from the external, the address latch unit outputs the latched address to output terminal when the control signal is inputted from the control block.

5. The semiconductor memory device according to claim 4, wherein the address latch unit outputs the latched address to output terminal directly during normal operation.

6. The semiconductor memory device according to claim 3, wherein the clock buffer unit disables the second internal clock signal when the control signal is inputted from the control block.

7. The semiconductor memory device according to claim 2, wherein the control block disables the control signal in a predetermined time after the command decoder generates column activation signal according to the control signal.

8. The semiconductor memory device having a memory cell array for storing data and a row buffer for storing data of a row of the memory cell array, comprising:

a command decoder for generating column activation signal, mode register set signal and first internal command signal;

a mode decoder for generating mode signals determining the generation time of column activation signal according to corresponding address signal when the mode register set signal is inputted from the command decoder;

a control block for generating control signal which controls the command decoder to generate the column activation signal at the time determined by the mode signals when the first internal command signal is inputted from the command decoder according to the input of the predetermined external command;

an address latch unit for latching address signal inputted from the external; and a clock buffer unit for generating a first internal clock signal for synchronizing the command decoder and a second internal clock signal for synchronizing the address latch unit by receiving an external clock signal and the control signal.

9. The semiconductor memory device according to claim 8, wherein if the predetermined external command is inputted from the external, the address latch unit outputs the latched address to output terminal when the control signal is inputted from the control block.

10. The semiconductor memory device according to claim 9, wherein the address latch unit outputs the latched address to output terminal directly during normal operation.

11. The semiconductor memory device according to claim 8, wherein the clock buffer unit disables the second internal clock signal when the control signal is inputted from the control block.

12. The semiconductor memory device according to claim 8, wherein the control block disables the control signal in a predetermined time after the command decoder generates column activation signal according to the control signal.

13. A method of controlling the semiconductor memory device having a row buffer and being compatible with a SRAM, the method comprising steps of:

storing data of a row of a memory cell array in the row buffer according to address signal when a single predetermined external command is inputted from the external; and outputting a part of the data determined by the address signal from the row buffer to the external without any additional command from the external, after a predetermined delay time from the step of storing data in the row buffer, wherein the part of the data are outputted to the external through the row buffer by one predetermined external command.

14. The method of controlling the semiconductor memory device having a row buffer according to claim 13, wherein the step of determining the delayed time is further included, prior to the step of storing data in the row buffer.

15. A method of controlling the semiconductor memory device having a row buffer comprising steps of:

storing data of a row of a memory cell array in the row buffer according to address signal when a predetermined external command is inputted from the external, wherein the step of storing data in the row buffer is performed by:

selecting a row of the memory cell array according to address signal when the row activation signal is outputted from the command decoder unit according to the input of the predetermined external command; and storing data of the selected row in the row buffer through a bit line sense amp; and outputting a part of the data determined by the address signal from the row buffer to the external without any additional command from the external, after a predetermined delay time from the step of storing data in the row buffer.

16. The method of controlling the semiconductor memory device having row buffer according to claim 13, wherein the step of outputting data is performed by automatically generating column activation signal after the predetermined delay time from the input of the predetermined external command.

* * * * *